United States Patent
Francken et al.

(10) Patent No.: US 9,831,110 B2
(45) Date of Patent: Nov. 28, 2017

(54) VISION-BASED WAFER NOTCH POSITION MEASUREMENT

(71) Applicant: Lam Research Corporation, Fremont, CA (US)

(72) Inventors: Gustavo G. Francken, Pleasanton, CA (US); Brandon Senn, Molalla, OR (US); Peter Thaulad, San Jose, CA (US); Zhuozhi Chen, Mountain View, CA (US); Richard K. Lyons, Sandy, OR (US); Christian DiPietro, Sherwood, OR (US); Christopher M. Bartlett, Beaverton, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 103 days.

(21) Appl. No.: 14/813,948

(22) Filed: Jul. 30, 2015

(65) Prior Publication Data

US 2017/0032510 A1    Feb. 2, 2017

(51) Int. Cl.
*H01L 21/68*    (2006.01)
*G06T 7/00*    (2017.01)
(Continued)

(52) U.S. Cl.
CPC .......... *H01L 21/681* (2013.01); *G06T 7/0004* (2013.01); *G06T 7/73* (2017.01);
(Continued)

(58) Field of Classification Search
CPC ............. H01L 21/67259; C23C 14/505; C23C 16/4584; C23C 16/4588; B23Q 17/2409;
(Continued)

(56) References Cited

U.S. PATENT DOCUMENTS 4,055,376 A    10/1977 Daberko
4,819,167 A    4/1989 Cheng et al.
(Continued)

FOREIGN PATENT DOCUMENTS

CA    2305919 A1    10/2000
EP    0462596 A1    12/1991
(Continued)

OTHER PUBLICATIONS

"International Preliminary Report on Patentability", Issued in PCT Application No. PCT/US2008/087556; dated Jul. 8, 2010, 4 pages.
(Continued)

*Primary Examiner* — Andrew Moyer
*Assistant Examiner* — Narek Zohrabyan

(57) ABSTRACT

A wafer alignment system includes an image capture device that captures an image of a wafer positioned on a pedestal. An image analysis module analyzes the image to detect an edge of the wafer and a notch formed in the edge of the wafer and calculates, based on a position of the notch, first and second edge positions corresponding to the edge of the wafer. An offset calculation module calculates an angular offset of the wafer based on the first position and the second edge positions. A system control module controls transfer of the wafer from the pedestal to a process cell based on the angular offset.

20 Claims, 7 Drawing Sheets

(51) Int. Cl.
  *G06T 7/73* (2017.01)
  *H01L 21/67* (2006.01)
(52) U.S. Cl.
  CPC ...... *H01L 21/67201* (2013.01); *H01L 21/682* (2013.01); *G06T 2207/30148* (2013.01); *Y10S 901/02* (2013.01); *Y10S 901/47* (2013.01)
(58) Field of Classification Search
  CPC ..... G01N 2021/887; G01N 2021/8887; G01N 21/8806; G01N 21/93; G01N 21/95692; G01N 21/8851; G01B 11/00; G02B 26/10; G06T 3/00; G06T 5/00; G06T 7/0002
  USPC ............ 382/141, 144, 145, 151; 156/345.24, 156/345.55
  See application file for complete search history.

(56) References Cited

U.S. PATENT DOCUMENTS

| | | | |
|---|---|---|---|
| 4,971,443 | A | 11/1990 | Koyagi |
| 5,530,548 | A | 6/1996 | Campbell et al. |
| 5,546,179 | A | 8/1996 | Cheng |
| 5,675,407 | A | 10/1997 | Geng |
| 5,822,213 | A | 10/1998 | Huynh |
| 5,999,268 | A | 12/1999 | Yonezawa et al. |
| 6,094,264 | A | 7/2000 | Wuyts |
| 6,114,705 | A | 9/2000 | Leavitt et al. |
| 6,126,382 | A | 10/2000 | Scales et al. |
| 6,188,323 | B1 | 2/2001 | Rosenquist et al. |
| 6,191,851 | B1 | 2/2001 | Kirkham et al. |
| 6,195,619 | B1 | 2/2001 | Ren |
| 6,339,730 | B1 | 1/2002 | Matsushima |
| 6,409,463 | B1 | 6/2002 | Croft et al. |
| 6,502,054 | B1 | 12/2002 | Mooring et al. |
| 6,629,053 | B1 | 9/2003 | Mooring |
| 6,747,746 | B2 | 6/2004 | Chizhov et al. |
| 6,847,730 | B1 * | 1/2005 | Beer ............... H01L 21/681 348/125 |
| 6,895,831 | B2 | 5/2005 | Hunter |
| 6,917,698 | B2 | 7/2005 | Obi |
| 6,952,255 | B2 | 10/2005 | Perry et al. |
| 7,158,280 | B2 | 1/2007 | Sandstrom |
| 7,197,828 | B2 | 4/2007 | Lof et al. |
| 7,227,628 | B1 * | 6/2007 | Sullivan ............ G01N 21/9501 250/559.46 |
| 7,352,440 | B2 | 4/2008 | Hoogendam et al. |
| 7,417,724 | B1 * | 8/2008 | Sullivan ............ G01N 21/9501 250/559.45 |
| 8,099,192 | B2 | 1/2012 | Genetti et al. |
| 8,755,935 | B2 | 6/2014 | Douki et al. |
| 8,860,955 | B2 | 10/2014 | Rodnick et al. |
| 8,954,287 | B2 | 2/2015 | Rodnick et al. |
| 2002/0068992 | A1 | 6/2002 | Hine et al. |
| 2003/0231950 | A1 | 12/2003 | Raaijmakers |
| 2004/0167743 | A1 | 8/2004 | Hosek |
| 2004/0258514 | A1 * | 12/2004 | Raaijmakers ......... H01L 21/681 414/416.08 |
| 2005/0102064 | A1 | 5/2005 | Donoso et al. |
| 2005/0137751 | A1 | 6/2005 | Cox et al. |
| 2005/0276920 | A1 | 12/2005 | Kim |
| 2006/0009047 | A1 | 1/2006 | Wirth et al. |
| 2006/0045666 | A1 | 3/2006 | Harris et al. |
| 2006/0100740 | A1 * | 5/2006 | Sakiya .................. B25J 9/1692 700/246 |
| 2006/0167583 | A1 | 7/2006 | Sundar |
| 2007/0095791 | A1 * | 5/2007 | Shinozaki ............ G03F 7/7075 216/92 |
| 2007/0112465 | A1 | 5/2007 | Sadighi et al. |
| 2007/0177963 | A1 | 8/2007 | Tang et al. |
| 2008/0061255 | A1 | 3/2008 | Park |
| 2008/0068618 | A1 * | 3/2008 | Kagami ................ H01L 21/681 356/620 |
| 2008/0071408 | A1 | 3/2008 | Hiroki |
| 2010/0272347 | A1 * | 10/2010 | Rodnick ................ H01J 37/20 382/151 |
| 2012/0271590 | A1 | 10/2012 | Sakhare et al. |
| 2013/0056635 | A1 | 3/2013 | Kimba et al. |
| 2013/0287536 | A1 * | 10/2013 | Koelmel ............... H01L 21/681 414/754 |
| 2013/0330848 | A1 * | 12/2013 | Minato ............... H01L 21/6838 438/16 |
| 2014/0207284 | A1 * | 7/2014 | Kiley .................... H01L 21/681 700/258 |

FOREIGN PATENT DOCUMENTS

| | | |
|---|---|---|
| EP | 1175970 A2 | 1/2002 |
| EP | 1669808 A2 | 6/2006 |
| JP | 2000-114347 A | 4/2000 |
| JP | 2001-210692 A | 8/2001 |
| JP | 2001-230302 A | 8/2001 |
| JP | 2002-313872 A | 10/2002 |
| JP | 2002-540388 A | 11/2002 |
| JP | 2004-050306 A | 2/2004 |
| JP | 2004-080001 A | 3/2004 |
| JP | 2004-288792 A | 10/2004 |
| JP | 2005-068502 A | 3/2005 |
| JP | 2007-501527 A | 1/2007 |
| JP | 2007-037967 A | 2/2007 |
| JP | 2007-324486 A | 12/2007 |
| JP | 2008-251968 A | 10/2008 |
| KR | 2005-0010849 A | 1/2005 |
| WO | WO-97-37376 A1 | 10/1997 |
| WO | WO-99-02996 A2 | 1/1999 |
| WO | WO-0057127 A1 | 9/2000 |
| WO | WO-0178114 A1 | 10/2001 |
| WO | WO-03087436 A1 | 10/2003 |
| WO | WO-2004-086465 A2 | 10/2004 |
| WO | WO-2005-028994 A2 | 3/2005 |
| WO | WO-2005-037495 A1 | 4/2005 |

OTHER PUBLICATIONS

"International Search Report", Issued in PCT Application No. PCT/US2008/087556; dated Aug. 7, 2009.
"Written Opinion", Issued in PCT Application No. PCT/US2008/087556; dated Aug. 7, 2009.
"International Search Report", Issued in PCT Application No. PCT/US2008/087684; dated Jul. 29, 2009.
"Written Opinion", Issued in PCT Application No. PCT/US2008/087684; dated Jul. 29, 2009.
"International Preliminary Report on Patentability", Issued in PCT Application No. PCT/US2008/087684; dated Jul. 8, 2010.
"International Search Report", Issued in PCT Application No. PCT/US2008/087775; dated Aug. 5, 2009.
"Written Opinion", Issued in PCT Application No. PCT/US2008/087775; dated Aug. 5, 2009.
"International Preliminary Report on Patentability", Issued in PCT Application No. PCT/US2008/087775, dated Jul. 8, 2010.
"International Search Report", Issued in PCT Application No. PCT/US2008/087578; dated Aug. 5, 2009.
"Written Opinion", Issued in PCT Application No. PCT/US2008/087578; dated Aug. 5, 2009.
"International Preliminary Report on Patentability", Issued in PCT Application No. PCT/US2008/087578; dated Jul. 8, 2010.

* cited by examiner

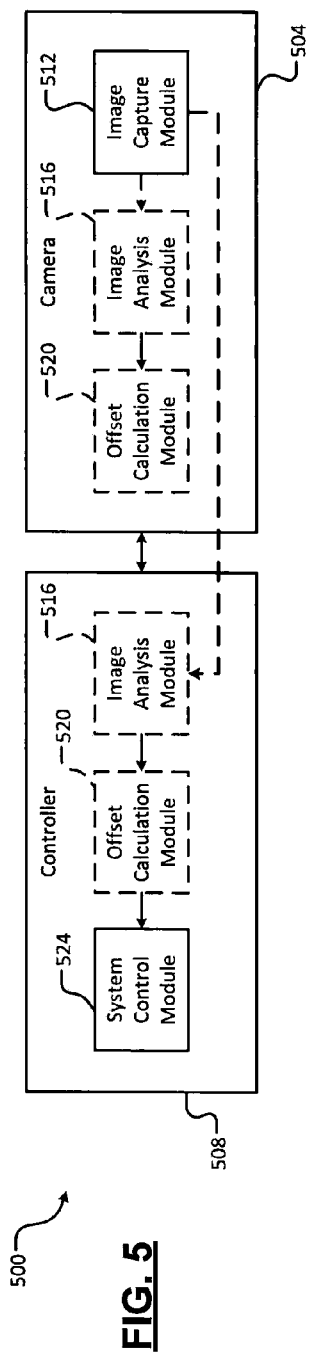
FIG. 5
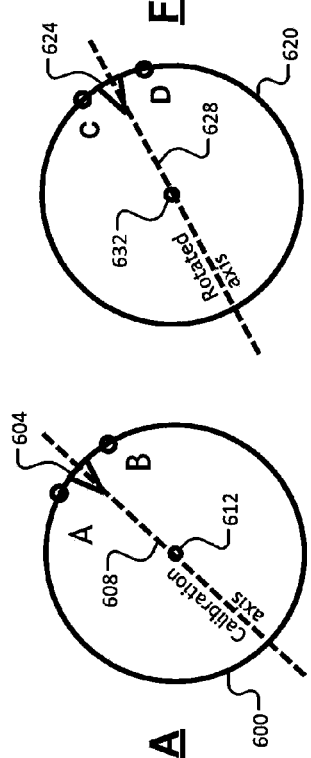
FIG. 6A
FIG. 6B
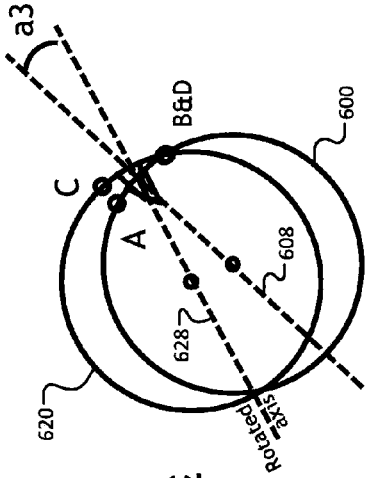
FIG. 6C

VISION-BASED WAFER NOTCH POSITION MEASUREMENT

CROSS-REFERENCE TO RELATED APPLICATIONS

The present application is related to U.S. patent application Ser. No. 14/813,895, filed on Jul. 30, 2015. The entire disclosure of the application referenced above is incorporated herein by reference.

FIELD

The present disclosure relates to substrate processing systems, and more particularly to systems and methods for positioning a semiconductor wafer in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching and/or other treatment of substrates such as semiconductor wafers. Example processing that may be performed on a substrate include, but are not limited to, a plasma enhanced chemical vapor deposition (PECVD) process, a chemically enhanced plasma vapor deposition (CEPVD) process, a sputtering physical vapor deposition (PVD) process, an ion implantation process, and/or other etch (e.g., chemical etch, plasma etch, reactive ion etch, etc.), deposition, and cleaning processes. A substrate may be arranged on a wafer processing substrate, such as a pedestal in a processing chamber of the substrate processing system. For example only, during etching, a gas mixture including one or more precursors is introduced into the processing chamber and plasma is struck to etch the substrate.

A load lock (e.g., an inbound or outbound load lock) or other transfer tool may be used to transfer semiconductor wafers from an atmospheric environment to a vacuum environment (i.e., from outside of the processing chamber into the processing chamber), or vice versa. The load lock itself may include a vacuum chamber containing a pedestal. The wafer is arranged on (and transferred to and from) the pedestal. For example, the wafer may be transferred from the pedestal to a plating or other process cell of a processing chamber in the substrate processing system for deposition, etching, etc. The pedestal lifts the wafer onto and off of a robot (e.g., an end effector of the robot) used to transfer the wafer between the load lock and the process cell.

SUMMARY

A wafer alignment system includes an image capture device that captures an image of a wafer positioned on a pedestal. An image analysis module analyzes the image to detect an edge of the wafer and a notch formed in the edge of the wafer and calculates, based on a position of the notch, first and second edge positions corresponding to the edge of the wafer. An offset calculation module that calculates an angular offset of the wafer based on the first position and the second edge positions. A system control module controls transfer of the wafer from the pedestal to a process cell based on the angular offset.

A wafer alignment method includes capturing an image of a wafer positioned on a pedestal, analyzing the image to detect an edge of the wafer and a notch formed in the edge of the wafer, calculating, based on a position of the notch, first and second edge positions corresponding to the edge of the wafer, calculating an angular offset of the wafer based on the first position and the second edge positions, and controlling transfer of the wafer from the pedestal to a process cell based on the angular offset.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 5 is a functional block diagram of an example wafer alignment system according to the principles of the present disclosure;

FIG. 6A is an example calibrated image of a test wafer according to the principles of the present disclosure;

FIG. 6B is an example image of a misaligned wafer according to the principles of the present disclosure; and FIG. 6C is an example comparison of the calibrated image and the image of the misaligned wafer according to the principles of the present disclosure;

In the drawings, reference numbers may be reused to identify similar and/or identical elements.

DETAILED DESCRIPTION

A semiconductor wafer (e.g., a 300 mm wafer) is positioned on a pedestal of a load lock to be transferred into and out of a processing chamber. The wafer is aligned on the pedestal to allow accurate capture and/or transfer of the wafer using a robot or other tool. Alignment of the wafer is achieved using a notch formed in an outer edge of the wafer. Various types of wafer aligners may be used to detect a position of the notch relative to the pedestal as the wafer is rotated (e.g., using a rotating chuck that includes the pedestal). For example, a sensor may detect the notch as the wafer is slowly rotated using the chuck. A notch location and wafer offset are calculated based on the detected notch and provided to the robot.

Wafer alignment systems and methods according to the principles of the present disclosure implement an image capture device (e.g., a camera) to capture an image of a stationary wafer on a pedestal. In particular, the camera captures an image of the edge of the wafer including the notch. An image analysis module analyzes the captured image to locate the notch and edge positions of the wafer relative to the notch. An offset calculation module calculates, using the location of the notch and the edge positions of the wafer, an angular offset of the wafer relative to a desired position. For example, the desired position may correspond to a calibrated reference position.

Figure 1:
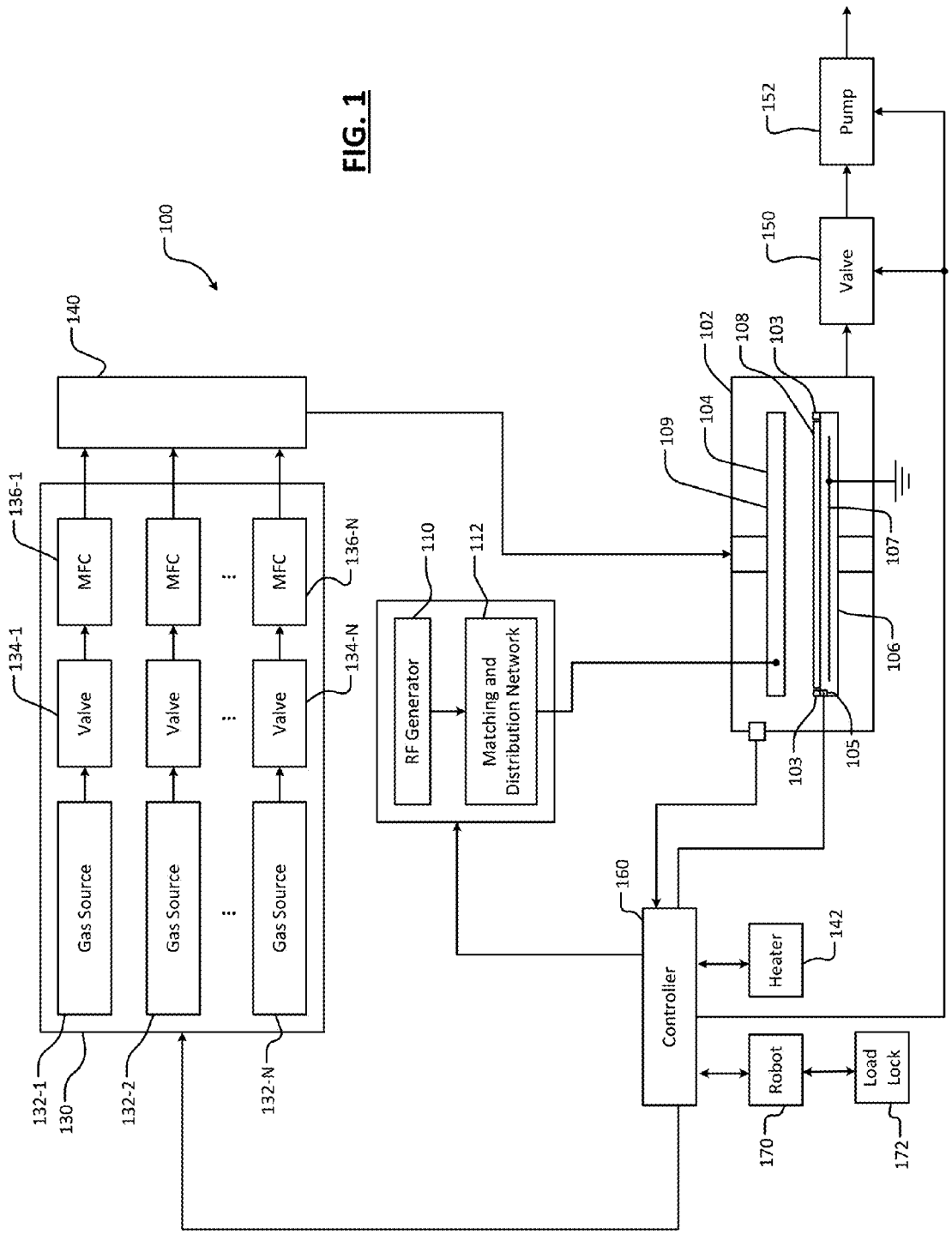
FIG. 1 is a functional block diagram of an example substrate processing system according to the principles of the present disclosure.

Referring now to FIG. 1, an example of a substrate processing system 100 for performing etching using RF plasma is shown. The substrate processing system 100 includes a processing chamber 102 that encloses other components of the substrate processing chamber 102 and contains the RF plasma. The substrate processing chamber 102 includes an upper electrode 104 and a pedestal 106 including a lower electrode 107. An edge coupling ring 103 is supported by the pedestal 106 and is arranged around the substrate 108. One or more actuators 105 may be used to move the edge coupling ring 103. During operation, a substrate 108 is arranged on the pedestal 106 between the upper electrode 104 and the lower electrode 107.

For example only, the upper electrode 104 may include a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner. The lower electrode 107 may be arranged in a non-conductive pedestal. Alternately, the pedestal 106 may include an electrostatic chuck that includes a conductive plate that acts as the lower electrode 107.

An RF generating system 110 generates and outputs an RF voltage to one of the upper electrode 104 and the lower electrode 107. The other one of the upper electrode 104 and the lower electrode 107 may be DC grounded, AC grounded or floating. For example only, the RF generating system 110 may include an RF voltage generator that generates the RF voltage that is fed by a matching and distribution network 112 to the upper electrode 104 or the lower electrode 107. In other examples, the plasma may be generated inductively or remotely.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A heater 142 may be connected to a heater coil (not shown) arranged in the pedestal 106. The heater 142 may be used to control a temperature of the pedestal 106 and the substrate 108. A valve 150 and pump 152 may be used to evacuate reactants from the processing chamber 102. A controller 160 may be used to control components of the substrate processing system 100. The controller 160 may also be used to control the actuator 105 to adjust a position of one or more portions of the edge coupling ring 103.

A robot 170 may be used to deliver substrates onto, and remove substrates from, the pedestal 106. For example, the robot 170 may transfer substrates between the pedestal 106 and a load lock 172 according to the principles of the present disclosure.

Figure 2A:
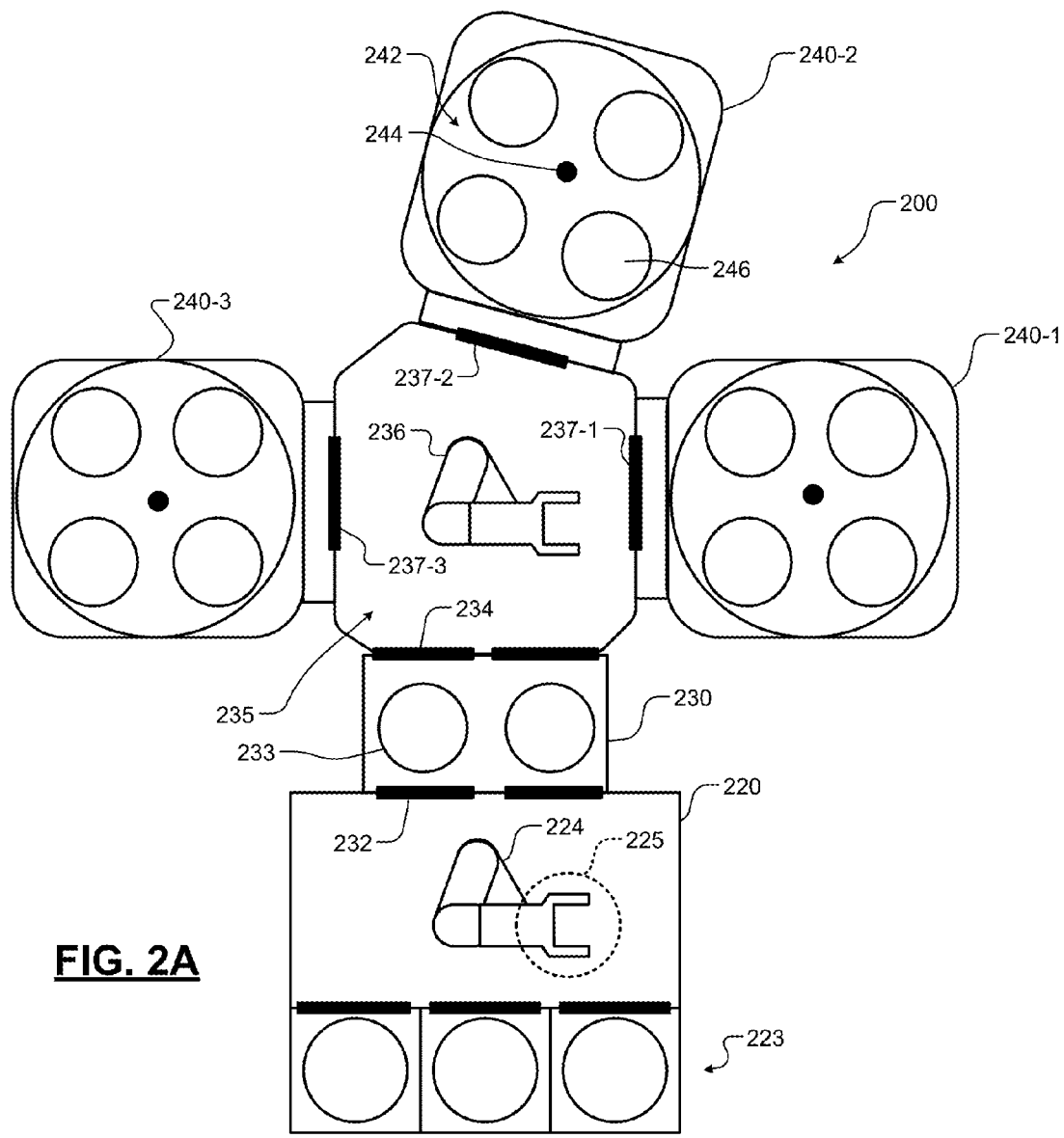
FIG. 2A is a functional block diagram of an example of substrate processing tool according to the principles of the present disclosure.

Referring now to FIG. 2A, a non-limiting example substrate processing tool 200 (e.g., as implemented within the substrate processing system 100) includes a transport handling chamber 220 and multiple reactors each with one or more substrate processing chambers. A substrate 225 enters the substrate processing tool 200 from a cassette and/or pod 223, such as a front opening unified pod (FOUP). A robot 224 includes one or more end effectors to handle the substrate 225. A pressure of the transport handling chamber 220 may be at atmospheric pressure. Alternately, the transport handling chamber 220 may be at vacuum pressure (with ports acting as slot valves).

Figure 2B:
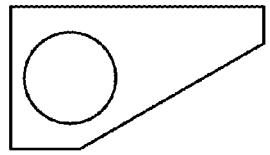
FIG. 2B is an example load lock.

The robot 224 moves the substrates 225 from the cassette and/or pod to a load lock 230. For example, the substrate 225 enters the load lock 230 through a port 232 (or isolation valve) and is placed on a load lock pedestal 233. The port 232 to the transport handling chamber 220 closes and the load lock 230 is pumped down to an appropriate pressure for transfer. Then a port 234 opens and another robot 236 (also with one or more end effectors) in a processing handling chamber 235 places the substrates through one of the ports 237-1, 237-2, 237-3 (collectively ports 237) corresponding to a selected reactor 240-1, 240-2, and 240-3 (collectively reactors 240). Although the load lock 230 is shown having multiple pedestals and associated ports, in embodiments the load lock 230 may include only a single pedestal and respective ports. For example only, another example load lock configuration is shown in FIG. 2B.

A substrate indexing mechanism 242 may be used to further position the substrates relative to the substrate processing chambers. In some examples, the indexing mechanism 242 includes a spindle 244 and transfer plates 246.

In some examples, at least one of the processing chambers or stations of the reactors 240 is capable of performing semiconductor processing operations, such as a material deposition or etch, sequentially or simultaneously with the other stations. In some examples, at least one or more of the stations may perform RF-based semiconductor processing operations.

The substrate is moved from one station to the next in the reactor 240 using the substrate indexing mechanism 242. One or more of the stations of the reactors 240 may be capable of performing, for example only, RF plasma deposition, etching, or other process steps according to the specific implementation of the substrate processing tool 200. During use, the substrates are moved to one or more of the reactors 240, processed and then returned. As can be appreciated, reducing the handling time of each substrate improves productivity and throughput.

The robots 224 and 236 transfer the substrates to and from the load lock 230 under the guidance of a controller (e.g., the controller 160 as shown in FIG. 1) according to the principles of the present disclosure. In particular, each substrate (i.e., wafer) includes a notch to facilitate a determination of the position (e.g., alignment) of the wafer with respect to the pedestal 233 of the load lock 230. Accurate determination of the position of the wafer in turn facilitates accurate capture, retrieval and transfer of the wafer (e.g., capture of the wafer by the robot 236 for transfer from the load lock 230 to the reactors 240.

Figure 3A:
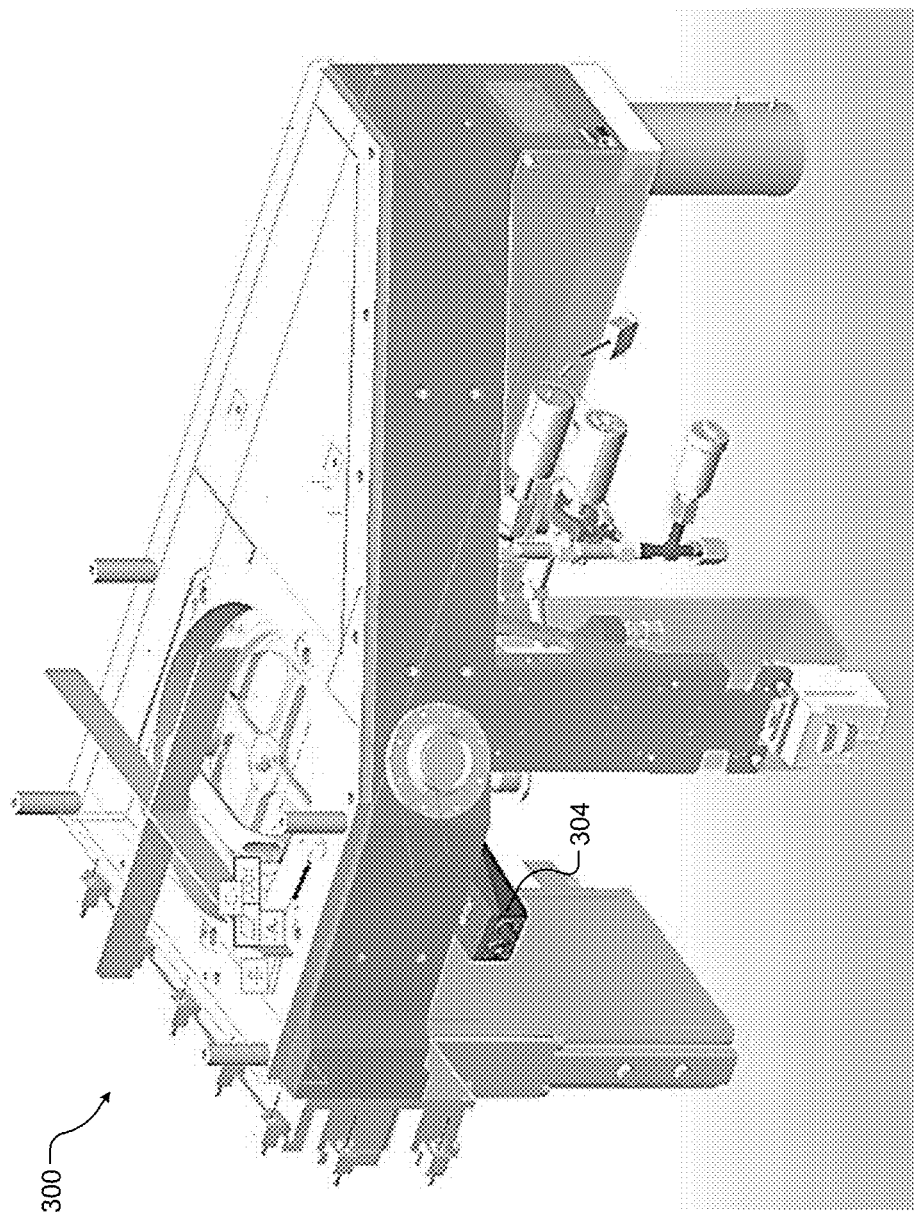
FIG. 3A is an example load lock and camera according to the principles of the present disclosure.
Figure 3B:
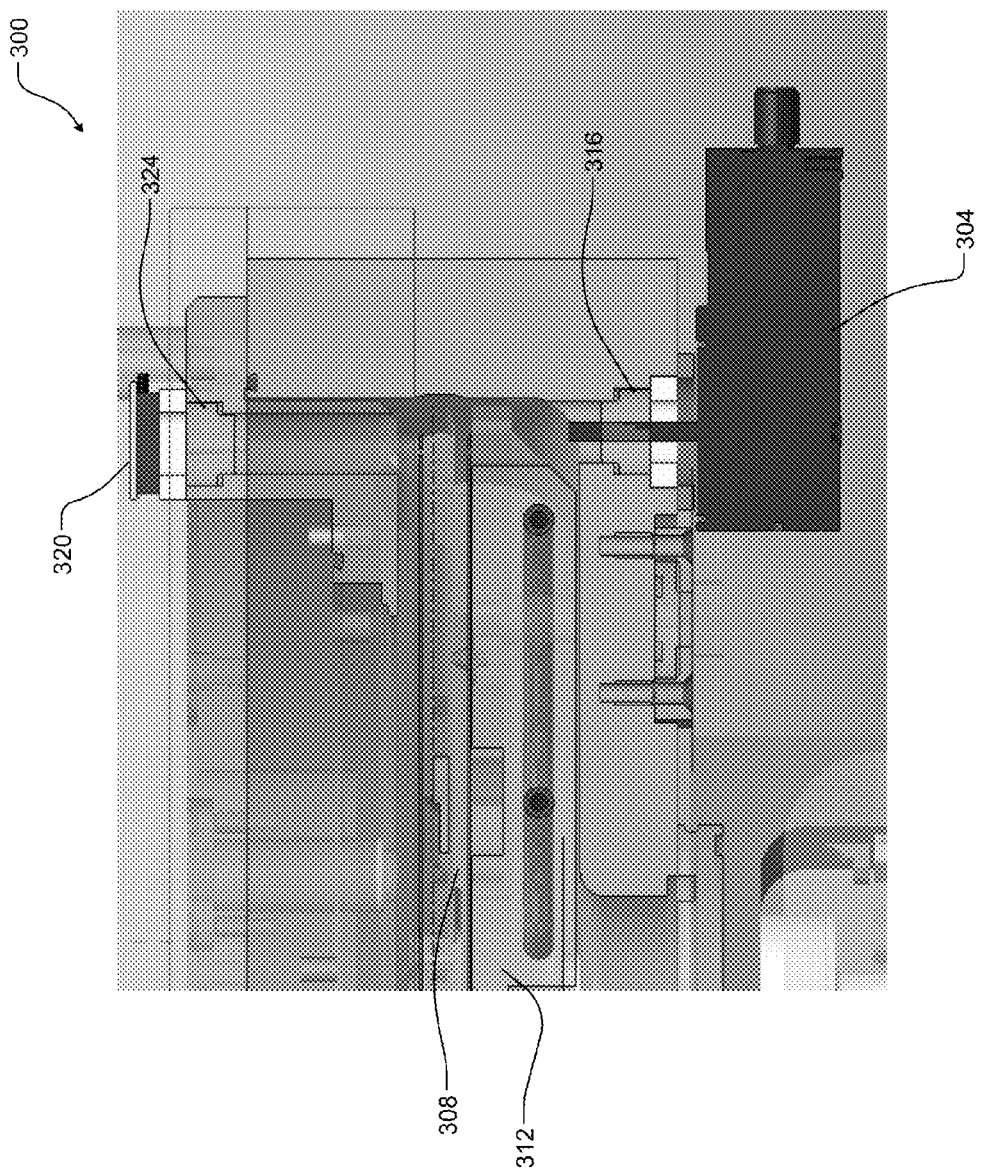
FIG. 3B is another view of the example load lock and camera according to the principles of the present disclosure.
Figure 3C:
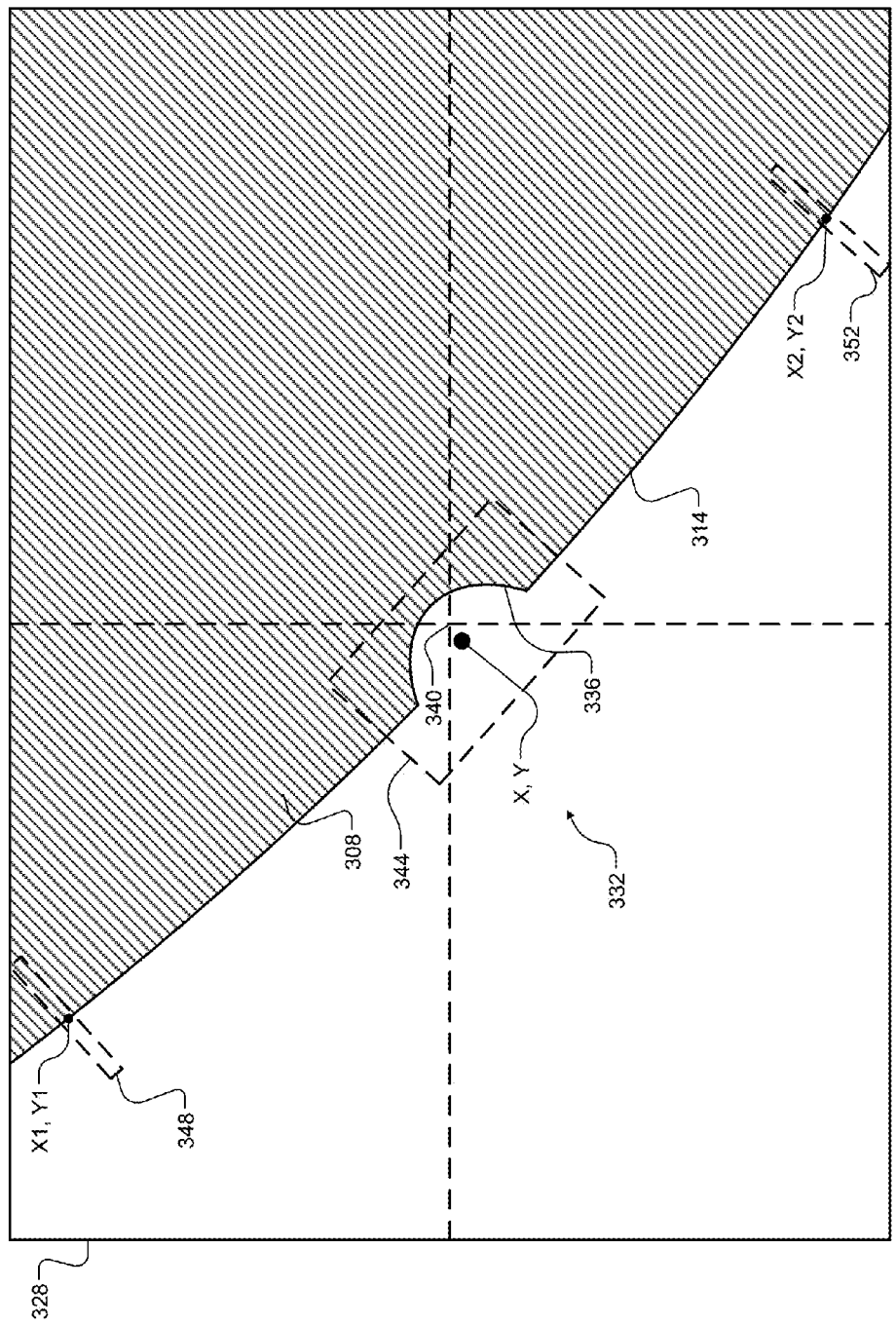
FIG. 3C is an example image of a wafer captured according to the principles of the present disclosure.

Referring now to FIGS. 3A, 3B, and 3C, an example load lock 300 and camera 304 are arranged to detect a position of a wafer 308 according to the principles of the present disclosure. Although the configuration of the load lock 300 corresponds to the example load lock shown in FIG. 2B, the load lock 300 may have a configuration similar to the load lock 230 of FIG. 2A or any other configuration. The wafer 308 is arranged on a pedestal 312 (e.g., a cool pedestal) within the load lock 300 (e.g., as placed by a robot or other appropriate tool). The camera 304 is positioned (e.g., with a lens of the camera 304 facing upward) to capture an image of a portion of the wafer 308. For example, the camera 304 captures an image of an edge 314 of the wafer 308 (e.g., through an aperture including a quartz or other type of window 316). The edge of the wafer 308 may be backlit (e.g., using an LED or other light source 320 projected downward through another window 324 past the edge of the wafer 308 and toward the camera 304) to illuminate a field of view 328 of the camera 304 as shown in FIG. 3C.

As shown in FIG. 3C, an example image 332 captured by the camera 304 includes the edge 314 of the wafer 308 within the field of view 328 of the camera 304. The camera 304 (and/or the controller 160 shown in FIG. 1, or another device or module as described below in more detail) analyzes the captured image 332 to locate the edge 314 of the wafer 308 and a notch 336 formed in the edge 314 of the wafer 308. For example, the camera 304 may be configured to identify and locate the notch 336 by detecting the curvature of the notch 336 (i.e., a notch profile).

The field of view 328 of the camera 304 may be fixed (i.e., constant) with respect to a coordinate system. For example, the coordinate system may correspond to a plurality of X, Y positions within the field of view 328, where a 0, 0 position 340 corresponds to a center point of the field of view 328. The camera 304 positions an object locator box 344 according to the detected position of the notch 336. For example, the object locator box 344 may be calibrated to latch onto a position X, Y centered on the detected notch 336 (e.g., according to the detected notch profile). Edge locator boxes 348 and 352 are positioned at X1, Y1 and X2, Y2, respectively, relative to the X, Y position of the object locator box 344. In other words, based on the X, Y position of the object locator box 344 and a known curvature of the wafer 308 (e.g., based on a known diameter of the wafer 308), positions X1, Y1 and X2, Y2 are positioned at a fixed distance (in opposite directions) from the X, Y position of the object locator box 344 along the edge 314 of the wafer 308. For example only, the edge locator boxes 348 and 352 may be positioned as far from the object locator box 344 as possible while still being within the field of view 328 to maximize accuracy.

For example, during an initial calibration using an optimally (e.g., within a desired tolerance) positioned test wafer, the object locator box 344 may be drawn around a notch of the test wafer. In other words, the test wafer is positioned such that the position of the notch of the test wafer corresponds as closely as possible to the 0, 0 position of the field of view 328 of the camera 304. In this manner, the X, Y position of the object locator box 344 during calibration corresponds directly to the position of the notch of the test wafer. With the object locator box 344 positioned accordingly, the X3, Y3 and X4, Y4 positions of the edge locator boxes 348 and 352 are selected to be a fixed distance from the X, Y position along an edge of the test wafer and within the field of view 328 of the camera 304. For example, for the test wafer, X3, Y3 may correspond to (X−A), (Y+B) while X4, Y4 may correspond to (X+), (Y−D).

With the object locator box 344 applied to the notch 336 of the wafer 308, the camera 304 positions the edge locator boxes 348 and 352 the same distances from the object locator box 344 as the positions (X−A), (Y+B) and (X+C), (Y−D) were from the object locator box 344 for the test wafer. However, the positions of the edge locator boxes 348 and 352 may be adjusted to be positioned along the edge 314 of the wafer 308. In other words, misalignment of the wafer 308 (e.g., lateral and/or angular offset) may cause the edge 314 of the wafer 308 to follow a different path than the edge of the test wafer. Accordingly, while the edge locator boxes 348 and 352 are positioned a same distance from the object locator box 344, the actual corresponding X1, Y1 and X2, Y2 positions of the wafer 308 may be shifted with respect to the X3, Y3 and X4, Y4 positions of the test wafer.

The X1, Y1 and X2, Y2 positions of the wafer 308 can be calculated based on the known distances from the X, Y position and the edge 314 of the wafer 308 as detected by the camera 304. The camera 304 compares the X1, Y1 and X2, Y2 positions to the X3, Y3 and X4, Y4 positions, respectively, and thereby calculate the lateral and angular offset of the wafer 308 as compared to the test wafer. A correction value is calculated based on the lateral and angular offset and used to adjust the position of the wafer 308 accordingly.

Figure 4:
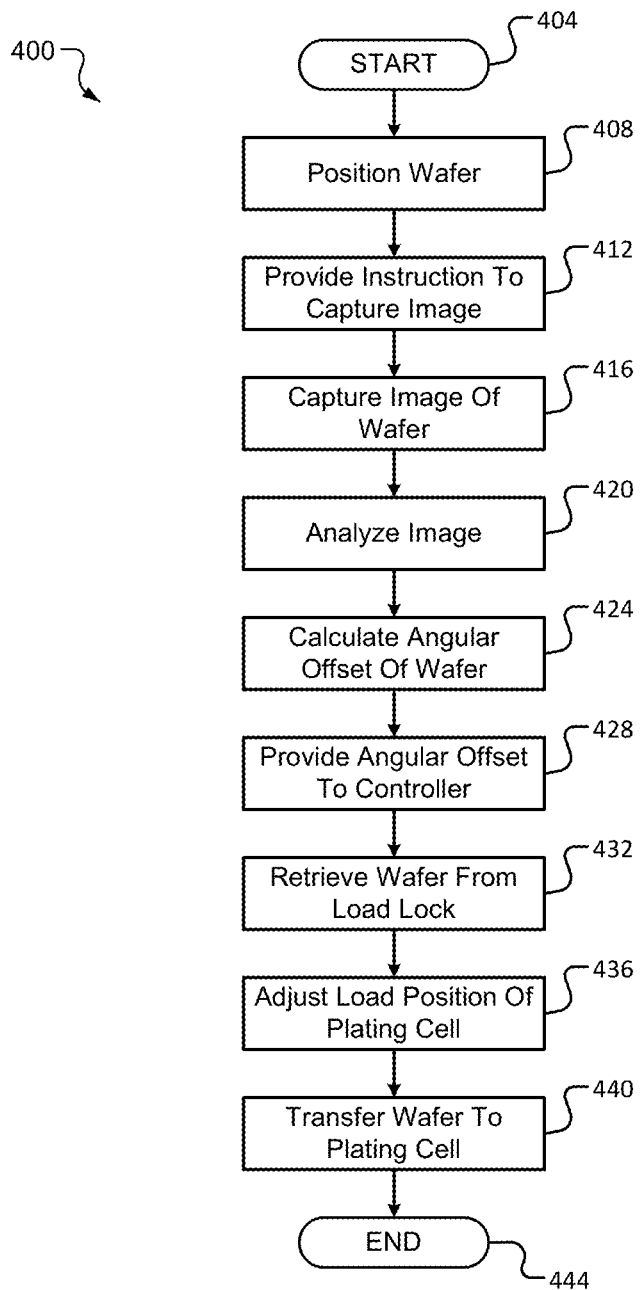
FIG. 4 illustrates steps of an example wafer alignment method according to the principles of the present disclosure.

Referring now to FIG. 4, an example wafer alignment method 400 according to the principles of the present disclosure begins at 404. The method 400 is implemented using various components of FIGS. 1-3C as described below. At 408, a wafer is positioned on a load lock (e.g., the load lock 300 of FIG. 3A). The wafer may be transferred to the load lock using the robot 224 under control of the controller 160. For example, the wafer is positioned on a cooling pedestal in a raised (up) position. At 412, a controller or control module (e.g., the controller 160) provides an instruction to a camera (e.g., the camera 304 of FIG. 3B) to perform a measurement of the position of the wafer. For example, the controller 160 may implement system software or firmware that generates and transmits a message to the camera 304. For example only, the message may correspond to an Ethernet message.

At 416, the camera 304 captures an image of the wafer (e.g., an edge of the wafer including a notch) as described above in FIG. 3C. At 420, the camera 304 processes and analyzes the image to detect and locate the notch and the edge of the wafer, including implementing the object locator box 344 and the edge locator boxes 348 and 352. At 424, the camera 304 calculates an angular offset and/or a lateral offset of the wafer (e.g., based on positions of the object locator box 344 and the edge locator boxes 348 and 352). At 428, the camera 304 provides the calculated angular offset and/or lateral offset to the controller 160 (e.g., via Ethernet message).

Although described as being performed by the camera 304, one or more of 420, 424, and 428 may be performed by the controller 160 or another component. For example, the camera 304 may capture the image but then provide the image to the controller 160 for analysis and calculation of the offsets, or the camera may capture and analyze the image and provide the positions of the object locator box 344 and the edge locator boxes 348 and 352 to the controller 160 for calculation of the offsets.

At 432, a plating robot (e.g., the robot 236) retrieves the wafer from the load lock 300. For example, the cooling pedestal of the load lock 300 may be lowered prior to the robot 236 retrieving the wafer. At 436, a load position of a process cell (e.g., a plating cell of a destination chamber of the wafer) is adjusted based on the calculated angular and/or lateral offsets. For example, the controller 160 controls (e.g., implementing system software/firmware) the load position of the process cell to compensate for the expected angular offset as calculated by the camera 304 or the controller 160. At 440, the robot 236 transfers the wafer to the process cell. The method 400 ends at 444.

Referring now to FIG. 5, a simplified example wafer alignment system 500 according to the principles of the present disclosure is shown. The wafer alignment system includes a camera 504 and a controller 508 (corresponding to, for example only, the camera 304 and the controller 160). The camera 504 includes an image capture module 512 and optionally includes an image analysis module 516 and an offset calculation module 520. The image capture module 512 controls the capture of an image of a wafer (e.g., an edge and notch of the wafer) as described in FIGS. 1-4. For example, the image capture module 512 is responsive to a command from the controller 508 to initiate the capture of the image of the wafer when the wafer is positioned on the load lock.

The image capture module 512 provides the captured image to the image analysis module 516. As shown, the image analysis module 516 may be located in the camera 504, the controller 508, or another controller or module of the system 500. The image analysis module 516 analyzes the image to detect the edge and notch of the wafer and calculate positions of the object locator box 344 and the edge locator boxes 348 and 352. The image analysis module 516 provides the calculated positions to the offset calculation module 520, which calculates the angular offset (and/or the lateral offset) using the calculated positions and calculated reference positions (i.e., calibrated positions). As shown, the offset calculation module 520 may be located in the camera 504, the controller 508, or another controller or module of the system 500.

The calculated offset (or offsets) are provided to a system control module 524 of the controller 508. Although shown as a single module, the system control module 524 may represent one or more modules related to control of a substrate processing system, such as control of plating robots, control of process cell load positions, etc. For the purposes of the present example, the system control module 524 controls a plating robot to retrieve the wafer from the load lock, adjust a load position (i.e., a rotational orientation) of a process cell according to the calculated offset, and control the robot to place the wafer on the process cell. In embodiments, an additional aligner or other component (e.g., of a front end module) may be controlled to align the notch prior to the wafer being placed into the load lock.

Referring now to FIGS. 6A, 6B, and 6C, an example calibrated image of a test wafer, an example image of a misaligned wafer, and an example comparison of the calibrated image and the image of the misaligned wafer, respectively, are shown. FIG. 6A shows a test wafer 600 having a notch 604. The notch 604 is aligned with an axis 608 (e.g., with respect to center point 612 of the test wafer 600, which, for a calibrated test wafer, may correspond to a center point of the pedestal). The image includes calculated positions A and B (i.e., calibrated positions), which correspond to, for example, X2, Y2 and X3, Y3 as described above in embodiments.

Conversely, the image of the wafer 620 as shown in FIG. 6B has a notch 624 aligned with an axis 628 (e.g., with respect to a center point 632 of the wafer 620). The wafer 620 is not properly aligned on the pedestal, and therefore the axis 628 is rotated with respect to the axis 608 of the test wafer 600. The image includes calculated positions C and D, which correspond to, for example, X1, Y1 and X2, Y2 as described above in embodiments.

FIG. 6C shows the image of the wafer 620 overlaying the image of the calibrated test wafer 600, illustrating an angular offset a3 between the axes 608 and 628. The systems and methods of the present disclosure as described above in FIGS. 1-5 calculate the angular offset a3 based on a comparison between the calibrated positions A and B of the test wafer 600 and the calculated positions C and D of the wafer 620.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term 'controller' may be replaced with the term 'circuit.' The term 'controller' may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The controller may include one or more interface circuits. In some examples, the interface circuits may include wired or wireless interfaces that are connected to a local area network (LAN), the Internet, a wide area network (WAN), or combinations thereof. The functionality of any given controller of the present disclosure may be distributed among multiple controllers that are connected via interface circuits. For example, multiple controllers may allow load balancing. In a further example, a server (also known as remote, or cloud) controller may accomplish some functionality on behalf of a client controller.

The term code, as used above, may include software, firmware, and/or microcode, and may refer to programs, routines, functions, classes, data structures, and/or objects. The term shared processor circuit encompasses a single processor circuit that executes some or all code from multiple controllers. The term group processor circuit encompasses a processor circuit that, in combination with additional processor circuits, executes some or all code from one or more controllers. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple controllers. The term group memory circuit encompasses a memory circuit that, in combination with additional memories, stores some or all code from one or more controllers.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. §112(f) unless an element is expressly recited using the phrase "means for," or in the case of a method claim using the phrases "operation for" or "step for."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A wafer alignment system comprising:
   an image capture device that captures an image of a wafer positioned on a pedestal;
   an image analysis circuit that analyzes the image to detect an edge of the wafer as captured in the image and a notch formed in the edge of the wafer as captured in the image, and that calculates first and second edge positions corresponding to the edge of the wafer based on (i) a position of the detected notch and (ii) expected distances of the first and second edge positions from the position of the detected notch as captured in the image;
   an offset calculation circuit that calculates an angular offset of the wafer based on the first edge position and the second edge position; and
   a system control circuit that controls transfer of the wafer from the pedestal to a process cell based on the angular offset.

2. The wafer alignment system of claim 1, wherein the first and second edge positions are a predetermined distance from the position of the detected notch in accordance with the expected distances.

3. The wafer alignment system of claim 1, wherein, to calculate the angular offset, the offset calculation circuit compares the first and second edge positions to third and fourth edge positions.

4. The wafer alignment system of claim 3, wherein the angular offset corresponds to a difference between the first edge position and the third edge position and a difference between the second edge position and the fourth edge position.

5. The wafer alignment system of claim 3, wherein the third and fourth edge positions correspond to an edge of a test wafer.

6. The wafer alignment system of claim 5, wherein the image analysis circuit calculates the third and fourth edge positions using an image taken while the test wafer is arranged in a reference position on the pedestal.

7. The wafer alignment system of claim 5, wherein the first, second, third, and fourth edge positions each correspond to coordinates within a field of view of the image capture device.

8. The wafer alignment system of claim 5, further comprising a light source arranged on a side of the wafer opposite the image capture device, wherein the light source is arranged to project light past the wafer toward the image capture device.

9. The wafer alignment system of claim 8, wherein the light source is arranged to illuminate a field of view of the image capture device.

10. The wafer alignment system of claim 1, wherein the system control circuit adjusts a load position of the process cell based on the angular offset prior to transferring the wafer to the process cell.

11. A wafer alignment method comprising:
    capturing an image of a wafer positioned on a pedestal;
    analyzing the image to detect an edge of the wafer as captured in the image and a notch formed in the edge of the wafer as captured in the image;
    calculating first and second edge positions corresponding to the edge of the wafer based on (i) a position of the detected notch and (ii) expected distances of the first and second edge positions from the position of the detected notch as captured in the image;
    calculating an angular offset of the wafer based on the first edge position and the second edge position; and
    controlling transfer of the wafer from the pedestal to a process cell based on the angular offset.

12. The wafer alignment method of claim 11, wherein the first and second edge positions are a predetermined distance from the position of the detected notch in accordance with the expected distances.

13. The wafer alignment method of claim 11, wherein calculating the angular offset includes comparing the first and second edge positions to third and fourth edge positions.

14. The wafer alignment method of claim 13, wherein the angular offset corresponds to a difference between the first edge position and the third edge position and a difference between the second edge position and the fourth edge position.

15. The wafer alignment method of claim 13, wherein the third and fourth edge positions correspond to an edge of a test wafer.

16. The wafer alignment method of claim 15, further comprising calculating the third and fourth edge positions using an image taken while the test wafer is arranged in a reference position on the pedestal.

17. The wafer alignment method of claim 15, wherein the first, second, third, and fourth edge positions each correspond to coordinates within a field of view of an image capture device.

18. The wafer alignment method of claim 15, further comprising, using a light source arranged on a side of the wafer opposite an image capture device, projecting light past the wafer toward the image capture device.

19. The wafer alignment method of claim 18, wherein the light source is arranged to illuminate a field of view of the image capture device.

20. The wafer alignment method of claim 11, further comprising adjusting a load position of the process cell based on the angular offset prior to transferring the wafer to the process cell.

* * * * *